(12) United States Patent
Iwata

(10) Patent No.: US 7,736,457 B2
(45) Date of Patent: Jun. 15, 2010

(54) PRINTED WIRING BOARD MANUFACTURING METHOD

(75) Inventor: Yoshiyuki Iwata, Ogaki (JP)

(73) Assignee: Ibiden Co., Ltd., Ogaki (JP)

( * ) Notice: Subject to any disclaimer, the term of this patent is extended or adjusted under 35 U.S.C. 154(b) by 734 days.

(21) Appl. No.: 11/567,344

(22) Filed: Dec. 6, 2006

(65) Prior Publication Data

US 2007/0193679 A1 Aug. 23, 2007

(30) Foreign Application Priority Data

Dec. 21, 2005 (JP) ............................ 2005-367974

(51) Int. Cl.
*B29C 65/02* (2006.01)
*B32B 37/18* (2006.01)
*B32B 38/10* (2006.01)

(52) U.S. Cl. .................. 156/247; 156/278; 29/852; 174/255

(58) Field of Classification Search .............. 156/250, 156/182, 247, 278, 290, 291, 307.1, 307.3, 156/307.7, 308.2; 29/830, 834, 840, 852; 174/255

See application file for complete search history.

(56) References Cited

U.S. PATENT DOCUMENTS

| | | | | |
|---|---|---|---|---|
| 5,002,818 A | * | 3/1991 | Licari et al. | 428/209 |
| 5,677,397 A | * | 10/1997 | Nakamura et al. | 525/481 |
| 6,418,615 B1 | | 7/2002 | Rokugawa et al. | |
| 6,988,312 B2 | * | 1/2006 | Nakamura et al. | 29/830 |
| 2004/0211751 A1 | | 10/2004 | Shuto et al. | |

FOREIGN PATENT DOCUMENTS

| | | |
|---|---|---|
| CN | 1481658 A | 3/2004 |
| DE | 19739717 A1 * | 4/1999 |
| JP | 2000-323613 | 11/2000 |
| JP | 2004-235323 | 8/2004 |
| JP | 2005-072063 | 3/2005 |
| TW | 575632 | 2/2004 |
| WO | 03/039219 | 5/2003 |

* cited by examiner

*Primary Examiner*—Philip C Tucker
*Assistant Examiner*—Sing P Chan
(74) *Attorney, Agent, or Firm*—Oblon, Spivak, McClelland, Maier & Neustadt, L.L.P.

(57) ABSTRACT

The present invention intends to provide a novel printed wiring board manufacturing method by which printed wiring boards can be manufactured with efficiency. A method of manufacturing a printed wiring board (FIG. 1B) according to the present invention includes a step for preparing two sets of copper clad laminates (FIG. 2A), a step for bonding the copper clad laminates (FIG. 2B), steps for forming lands on both surfaces of a bonded laminate (FIGS. 2C to 2E), steps for forming respective resin layers on both surfaces of the bonded laminate and forming via hole openings to form respective via holes (FIGS. 2F to 2L), a step for forming a resin layer and forming a via hole opening to form a via hole (FIG. 2M), a step for separating the bonded laminate from each other (FIG. 2N) and steps for forming via hole openings from the bonded surface of the separated laminate to form via holes (FIGS. 2O to 2T). Via holes (33-1, 33-2) formed on the resin layer and a via hole (42) formed on the laminate are opened in the opposite directions.

14 Claims, 13 Drawing Sheets

PRINTED WIRING BOARD MANUFACTURING METHOD

BACKGROUND OF THE INVENTION

1. Field of the Invention

The present invention relates generally to printed wiring board manufacturing methods, and particularly to a printed wiring board manufacturing method by which printed wiring boards can be manufactured efficiently.

2. Description of the Related Art

Japanese Patent Laid-Open Publication No. 2000-323613 has disclosed a multilayer printed wiring board manufacturing method capable of manufacturing thin multilayer printed wiring boards for use with semiconductor devices. According to this multilayer printed wiring board manufacturing method, copper plate are used as support plates, via holes, conductor wirings and insulating layers are sequentially formed in the direction from a semiconductor device mounting layer with a semiconductor device mounting surface to an external connection terminal attachment layer with an external connection terminal attachment surface and a thin multilayer printed wiring layer can be manufactured by removing the copper plates.

[Patent Document 1]: Japanese Patent Laid-Open Publication No. 2000-323613 "SEMICONDUCTOR DEVICE MULTILAYER SUBSTRATE AND MANUFACTURING METHOD THEREOF" (published on Nov. 24, 2000)

SUMMARY OF THE INVENTION

The above-mentioned multilayer printed wiring board needs a large number of gates built-in a semiconductor device (IC chip) to be mounted thereon. Accordingly, since a printed wiring board also should be formed as a multilayer printed wiring board and a conductor pattern should be formed with high density, it is unavoidable that such multilayer printed wiring board should be manufactured through a very large number of manufacturing processes.

Each of these manufacturing processes is indispensable for manufacturing predetermined multilayer printed boards and any of these manufacturing processes may not be omitted.

Accordingly, a development of a printed wiring board manufacturing method capable of efficiently manufacturing printed wiring boards without omitting each manufacturing process has been desired.

Therefore, the object of the present invention intends to provide a novel printed wiring board manufacturing method capable of manufacturing printed wiring boards with high efficiency.

In consideration of the above object, a printed wiring board manufacturing method of the present invention comprises the steps of: preparing two sets of copper clad laminates; bonding said copper clad laminates; forming lands on both surfaces of said bonded laminates; forming respective resin layers on both surfaces of said bonded laminates and forming via hole openings to form respective via holes; and separating said bonded laminates from each other.

Further a printed wiring board manufacturing method of the present invention comprises the steps of: preparing two sets of copper clad laminates; bonding said two sets copper clad laminates; forming lands on both surfaces of said bonded laminates; forming respective resin layers on both surfaces of said bonded laminates and forming via hole openings to form respective via holes; separating said bonded laminates from each other; and forming a via hole opening on the bonded surface of said separated laminate to form a via hole, wherein the via hole formed on said resin layer and the via hole formed on said laminate are directed in the opposite directions.

Further, in the printed wiring board manufacturing method, said copper clad laminate each may be made of a material produced by heating and pressing a glass woven fabric base material or a glass non-woven fabric base material with copper foils laminated on both sides or one side thereof after said glass woven fabric base material or said glass non-woven fabric base material was impregnated with a thermosetting resin.

Further, in the printed wiring board manufacturing method, it may further comprises a step for repeating more than one time a step for forming respective resin layers on the upper surface of said resin layer and forming via hole openings to form respective via holes.

Further a printed wiring board manufacturing method of the present invention comprises the steps of: preparing two sets of support plates; bonding said two sets of support plates; forming lands on both surfaces of said bonded support plate; forming first resin layers on both surfaces of said support plate and forming via hole openings to form via holes; and separating said bonded support plate from each other.

Further a printed wiring board manufacturing method of the present invention comprises the steps of: preparing two sets of support plates; for bonding said two sets of support plates; for forming lands on both surfaces of said bonded support plate; for forming first resin layers on both surfaces of said support plate and forming via hole openings to form via holes; separating said bonded support plate from each other; removing said respective support plates; and forming a second resin layer on the lower surface of said first resin layer and forming a via hole opening to form a via hole, wherein the via holes formed on the first resin layer formed beforehand on the upper surface of said support plate and the via hole formed on said second resin layer formed after said support plates were removed are opened in the opposite directions.

Further, in the printed wiring board manufacturing method, said support plate may be formed of a copper plate.

Further, in the printed wiring board manufacturing method, it may further comprises a step for repeating more than one time a step for forming respective resin layers on the upper surface of said first resin layer and forming via hole openings to form respective via holes.

Further, in the printed wiring board manufacturing method, said step for bonding said copper clad laminates or said support plates may use as adhesive a thermosetting resin that is not be softened and melted at a treatment temperature of each process but that is softened and melted at a temperature below a temperature at which a printed wiring board is caused to deteriorate.

Further, in the printed wiring board manufacturing method, said temperature below a temperature at which the printed wiring board is caused to deteriorate may be under 240° C.

Further, in the printed wiring board manufacturing method, said step for bonding the copper clad laminates or said support plates may use a removable resist as adhesive to bond said copper clad laminates.

Further, in the printed wiring board manufacturing method, said step for bonding the copper clad laminates may bond said copper clad laminates by partially soldering said copper clad laminates.

According to the present invention, it is possible to provide a novel printed wiring board manufacturing method by which printed wiring boards can be manufactured with high efficiency.

Figure 1A:
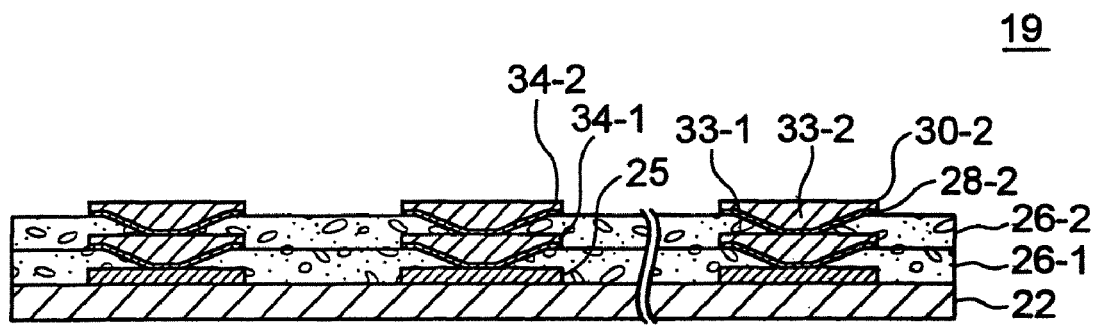
FIG. 1A is a cross-sectional view of an example of a multilayer printed wiring board according to a first embodiment of the present invention.

10: conventional multilayer printed wiring board, 11,12: each layer, 13: solder bump, 14,14-1,14-2: land, 15: land, 20: multilayer printed wiring board according to the first embodiment, 21: glass cloth base epoxy resin impregnated copper clad laminate, 22: lowermost layer, core layer, laminate, 22a: opening, 23: copper foil, 25: land, 26-1,26-2: resin layer, 27: protrusions, anchor, 28-1,28-2: electroless plated layer, 29-1, 29-2: electrolytic copper plated layer, 30,31: multilayer printed wiring board according to the second embodiment 32-1,32-2: etching resist, 33-1,33-2: via hole, 42: via hole, 52: resin layer, 60: support plate, copper plate, 70: adhesive, soldering

DESCRIPTION OF THE PREFERRED EMBODIMENTS

A printed wiring board manufacturing method according to the embodiments of the present invention will be described below in detail with reference to the accompanying drawings. In the sheets of drawings which will follow, identical elements and parts are denoted by identical reference numerals and therefore need not be repeatedly described.

A manufacturing method according to a first embodiment of the present invention, which will be described hereinafter, relates to a multilayer printed wiring board including a core layer and a manufacturing method according to a second embodiment of the present invention relates to a coreless multilayer printed wiring board.

First Embodiment

Arrangement of Multilayer Printed Wiring Board

First, arrangements of multilayer printed wiring boards manufactured by the manufacturing methods according to the first embodiment of the present invention will be described in brief.

Figure 1B:
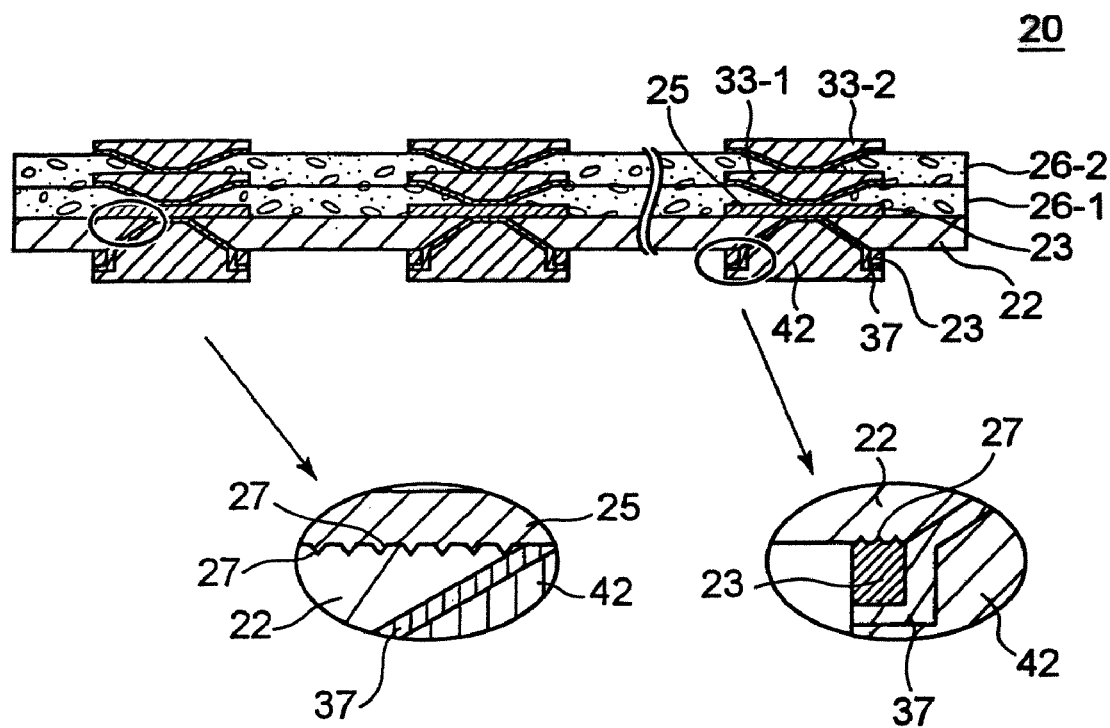
FIG. 1B is a cross-sectional view of another example of the multilayer printed wiring board according to the first embodiment of the present invention.

FIGS. 1A and 1B of the accompanying drawings are respectively cross-sectional views showing arrangements of multilayer printed wiring boards 19 and 20. The multilayer printed wiring board 19 shown in FIG. 1A might be a multilayer printed wiring board manufactured by an ordinary build-up process. While the multilayer printed wiring board 20 shown in FIG. 1B is a multilayer printed wiring board similarly manufactured by the ordinary build-up process, this multilayer printed wiring board 20 might be a multilayer printed wiring board which can be made difficult to warp and in which malconnection between it and the semiconductor device mounted thereon can be decreased.

The multilayer printed wiring board 19 shown in FIG. 1A includes a core layer 22, a first resin layer 26-1, a via hole 33-1 formed on the first resin layer 26-1, a second resin layer 26-2 located on the upper surface of the first resin layer 26-1 and a via hole 33-2 formed on the second resin layer 26-2.

The core layer 22 may be typically made of an FRP (fiber-reinforced plastic) typically and it is more preferable that a glass epoxy copper clad laminate for the core layer 22 can be used as a starting material.

It should be noted that, while FIG. 1A introduces the first and second resin layers 26-1 and 26-2 as the resin layers, the first embodiment is not limited thereto and it may be formed as a printed board in which one or more than three necessary resin layers should be formed on the upper surface of the core layer 22.

The multilayer printed wiring board 20 shown in FIG. 1B includes the first resin layer 26-1, the via hole 33-1 formed on the first resin layer 26-1, the second resin layer 26-2 located on the upper surface of the first resin layer 26-1, the via hole 33-2 formed on the second resin layer 26-2, the core layer 22 located on the first resin layer 26-1 at its opposite surface (lower surface side) of the second resin layer 26-2 and a via hole 42 formed on the core layer 22. Openings of the via holes 33-1, 33-2 and the via hole 42 are directed in the opposite directions.

This multilayer printed wiring board 20 is described more fully in Japanese patent application No. 2005-319432 filed by the same assignee of the present application, entitled as "MULTILAYER PRINTED WIRING BOARD FOR SEMICONDUCTOR DEVICE AND MANUFACTURING METHOD THEREOF" (filed on Nov. 2, 2005). It should be noted that Japanese patent application No. 2005-319432 was not yet laid open to public at a point of time in which the present application was filed in the Japan Patent Office.

Herein, as shown in FIGS. 1A and 1B, while the cross-sections of the via holes 33-1 and 33-2 in the first and second resin layers 26-1 and 26-2 may be shaped like inverse trapezoids, the cross-section of the via hole 42 formed in the lowermost layer 22 may be shaped like a trapezoid and vice versa.

The core layer 22 of the lowermost layer is typically made of an FRP. Further, this lowermost layer 22 should be made in such a manner that a glass epoxy copper clad laminate is typically used as a starting material and that a copper foil 23 on the laminate (i.e. lowermost layer) 22 is employed.

It should be noted that, while FIG. 1B introduces the first and second resin layers 26-1 and 26-2 as the resin layers, the first embodiment is not limited thereto. For example, the resin layer may be formed as a printed board having one or more than three necessary resin layers formed on the upper surface of the core layer 22.

The multilayer printed wiring board 20 according to the first embodiment of the present invention shown in FIG. 1B has the following advantages:

(1) In the multilayer printed wiring board 20, since the openings of the via holes 33-1 and 33-2 formed on the first and second resin layers 26-1 and 26-2 and the via hole 42 formed on the core layer 22 are directed in the opposite directions, the first and second resin layers 26-1, 26-2 and the core layer 22 are also caused to warp in the opposite directions. As a result, the multilayer printed wiring board 20 is very difficult to warp when heated upon reflow of soldered bumps, thereby resulting in a gap between the semiconductor device and the printed wiring board being made nearly constant. Accordingly, the multilayer printed wiring board 20 according to the first embodiment of the present invention might be substantially free from a problem of malconnection;

(2) Also, the core layer 22 may be typically made of a glass epoxy copper clad laminate. A plurality of glass woven fabrics (not shown) making the glass base material may be very excellent in dimension stability relative to the application of heat. Accordingly, as compared with a layer made of only a resin, the core layer 22 has a very small coefficient of thermal expansion and excellent dimension stability. When a semiconductor device is mounted on the printed wiring board, a semiconductor device (not shown), the first and second resin layers 26-1, 26-2 and the core layer 22 are mounted in that order, and the first and second resin layers 26-1 and 26-2 are sandwiched by the semiconductor device and the core layer 22, each of which has a small coefficient of thermal expansion as compared with those of the first and second resin layer 26-1 and 26-2. Therefore, a quantity in which the semiconductor device mount substrate is caused to warp can be decreased in thermal cycle test executed after the semiconductor device was mounted on the multilayer printed wiring board and the multilayer printed wiring board becomes difficult to crack; and (3) The lowermost layer 22 may be constructed using the glass epoxy copper clad laminate as the starting material and make effective use of the copper foil 23 on the laminate 22. It is customary that the copper foil 23 is treated by a matte treatment (roughing treatment) at its side opposing the laminate 22 in order to maintain adequate adhesion strength between the copper foil 23 and the laminate 22 as shown by elliptic views in FIG. 1B in an enlarged-scale. Microscopic observation on the elliptic views of FIG. 1B may reveal that protrusions (anchors) 27 bit the laminate 22, thereby being adhering to the laminate 22 very strongly. Accordingly, the copper foil 23 and the laminate 22 are joined with very large adhesion strength and hence the printed wiring board can be made strong.

(Manufacturing Method)

Next, a method of manufacturing the multilayer printed wiring boards 19 and 20 shown in FIGS. 1A and 1B will be described in due order with reference to FIGS. 2A to 2T. In the processes shown in FIGS. 2B to 2M, two sets of printed wiring boards are bonded back to back with each other and they are treated simultaneously or successively. In the following processes shown in FIGS. 2N to 2T, two sets of printed wiring boards are separated from each other and each set of the printed wiring board may be treated individually. According to the above-mentioned processes, the efficient manufacturing of multilayer printed wiring board can be achieved on the whole.

Figure 2A:
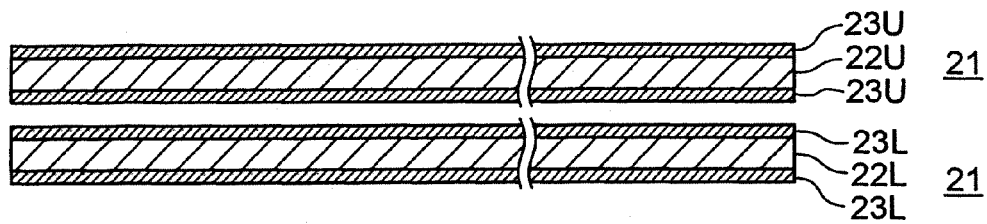
FIGS. 2A to 2T are diagrams showing respective processes of a multilayer printed wiring board manufacturing method according to a first embodiment of the present invention, respectively.

As shown in FIG. 2A, two sets of double-side copper clad laminates (e.g. FR-4 (flame retardant grade 4)) are typically prepared as starting materials. It should be noted that printed boards shown on the upper sides of FIGS. 2A to 2M are denoted by reference numerals with letters "U" and that printed boards shown on the lower sides of FIGS. 2A to 2M are denoted by reference numerals with letters "L" so as to clearly discriminate the upper and lower printed boards from each other.

Although not shown, two sets of laminates 22U and 22L serving as the core base materials comprise one or more glass woven fabrics impregnated with a thermosetting epoxy resin and copper foils 23U and 23L are provided on both surfaces of the laminates 22U and 22L and then cured. For example, a 0.06 mm-thick glass epoxy double-side copper clad laminate with a copper foil of 12 microns can be used as the two sets of laminates 22U and 22L. At that time, it is preferable that two glass woven fabrics may be used as the base material.

In stead of the above glass cloth base epoxy resin impregnated laminate, a glass cloth base bismaleimido-triazine resin impregnated laminate, a glass cloth base polyphenylene ether resin impregnated laminate or a glass cloth base polyimide resin impregnated laminate can be used as the laminates 22U and 22L. The core layer 22 should preferably have a thickness ranging of from 0.04 to 0.40 mm. If the thickness of the core layer 22 falls within the above-mentioned range, then warp of the multilayer printed wiring board can be decreased owing to rigidity of the core layer and cancellation of the warping directions of the core layer and the resin layer.

Figure 2B:
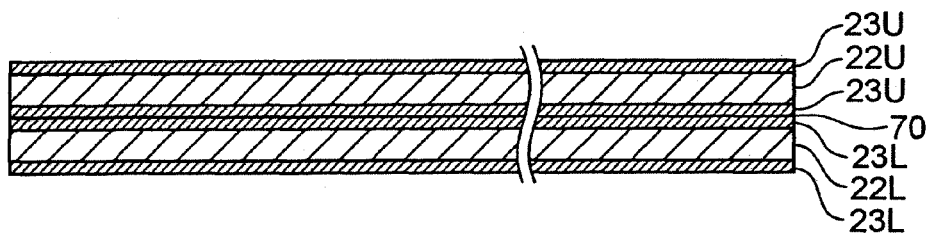

As shown in FIG. 2B, the two sets of laminates 22U and 22L are bonded back to back with each other by adhesive 70. Any adhesives may be used as the adhesive 70 insofar as they can satisfy the following conditions.

(1) Adhesive may be able to prevent the two sets of printed wiring boards from being separated each other in the treatments of the respective processes shown in FIGS. 2B to 2M. In particular, adhesive may be able to prevent the two sets of printed wiring boards from being separated from each other at temperatures in which the two sets of printed wiring board are treated in these processes;

(2) Adhesive may not contaminate treatment solutions and the like which are required in the respective processes shown in FIGS. 2B to 2M; and (3) Adhesive may allow the two sets of printed wiring boards to be separated from each other at a temperature less than a temperature at which the printed wiring board is caused to deteriorate. Further, it is preferable that the adhesive should allow the two sets of printed wiring boards to be separated from each other at a temperature under soldering temperature that is a maximum temperature at which the printed boards may be exposed.

From the above-mentioned reasons, it may be preferable to select thermoplastic resins that can be prevented from being softened and melted at temperatures in which they are treated in the respective processes shown in FIGS. 2B to 2M but that can be softened and melted at a temperature less than the temperature at which the printed wiring board is caused to deteriorate or a temperature under the soldering temperature. Alternatively, the two sets of printed wiring boards may be compression-bonded together by coating the printed wiring board with a removable resist. Alternatively, the two sets of printed wiring boards may be bonded to each other by soldering. If the two sets of printed wiring boards may be bonded to each other by soldering, then they may not be bonded together on the whole surface but it is preferable that they should be partially bonded by soldering.

Figure 2C:
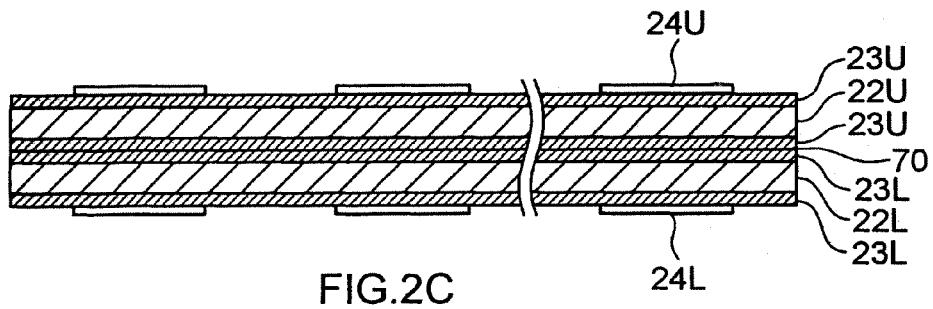

Then, as shown in FIG. 2C, etching resists 24U and 24L are respectively formed on the upper copper foils 23U and 23L at their portions which are desired to remain as future patterns.

Figure 2D:
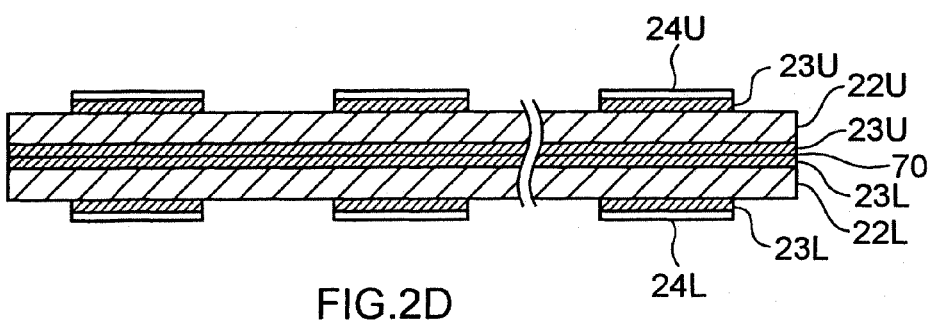

Then, as shown in FIG. 2D, the copper foils 23U and 23L are removed at their portions except the portions covered with the etching resists 24U and 24L by etching.

Figure 2E:
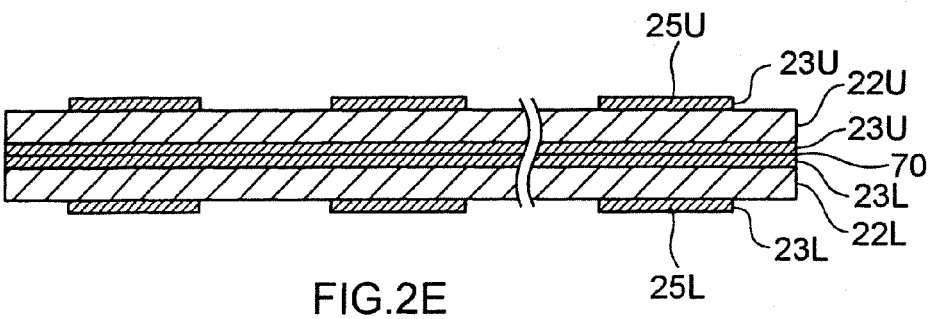

Then, as shown in FIG. 2E, the etching resists 24U and 24L are respectively removed from the copper foils 23U and 23L, and lands 25U and 25L using the copper foils 23U and 23L are respectively formed on the respective upper surfaces of the laminates 22U and 22L.

Figure 2F:
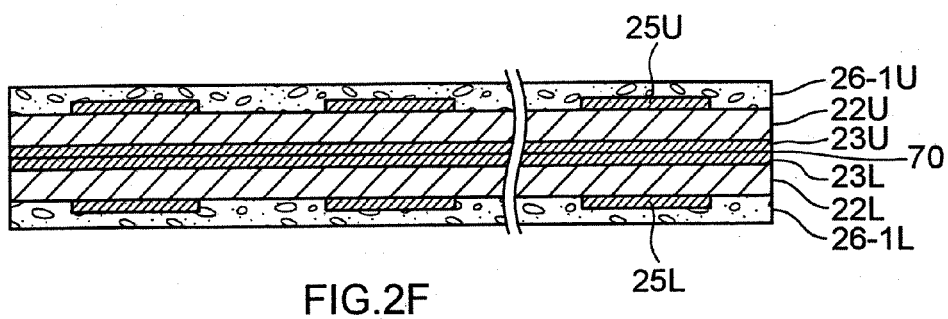

Then, as shown in FIG. 2F, resist layers 26-1U and 26-1L are respectively formed on respective upper surfaces of the laminates 22U and 22L. The resin layers 26-1U and 26-1L can be typically formed by heating semi-cured resin sheets like prepreg, interlayer insulator resin films and the like after being bonded on the laminates 22U and 22L. Alternatively, the resin layers 26-1U and 26-1L can be formed by heating screen-printed resins before being cured. It should be noted that the lands 25U and 25L may be treated by surface roughing before the resin layers 26-1U and 26-1L are formed on the respective upper surfaces of the laminates 22U and 22L.

Figure 2G:
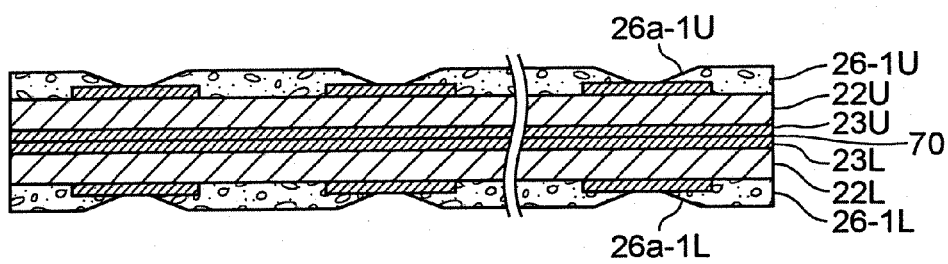

Then, as shown in FIG. 2G, openings 26a-1U and 26a-1L, which are used to form via holes, are respectively formed on the resin layers 26-1U and 26-1L at their positions above the lands 25U and 25L with laser irradiation using carbon dioxide laser, for example. At that time, the copper lands 25U and 25L may function as stoppers required when the openings 26a-1U and 26a-1L are formed, thereby preventing the openings 26a-1U and 26a-1L from extending beyond the upper surfaces of the lands 25U and 25L, respectively. The thus formed openings 26a-1U and 26a-1L may be shaped like inverse trapezoids so that they are wide in the front but that they are gradually tapered in the bottom. In this case, the cross-section of the via hole is not shaped like a rectangle but it is generally shaped like an inverse trapezoid.

It should be noted that other suitable lasers such as excimer laser, YAG laser (yttrium aluminum garnet laser) or UV laser (ultraviolet laser) can be used instead of the above carbon dioxide laser. Further, when the openings 26a-1U and 26a-1L are formed, protective films such as a PET (polyethylene terephthalate) film can be used if requested. This relationship applies for other via hole openings as well.

Figure 2H:
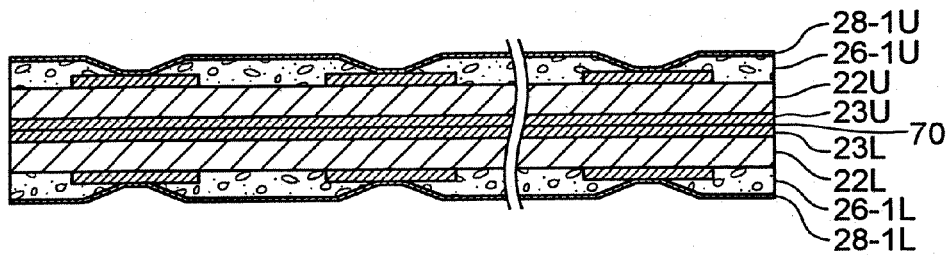

As shown in FIG. 2H, catalytic nucleus for electroless plating is formed on the resin layer 26 with the openings 26a-1U and 26a-1L, by which electroless plated layers 28-1U and 28-1L having a thickness approximately ranging of from 0.6 to 3.0 microns can be respectively formed on the resin layers 26-1U and 26-1L by electroless copper plating.

Figure 2I:
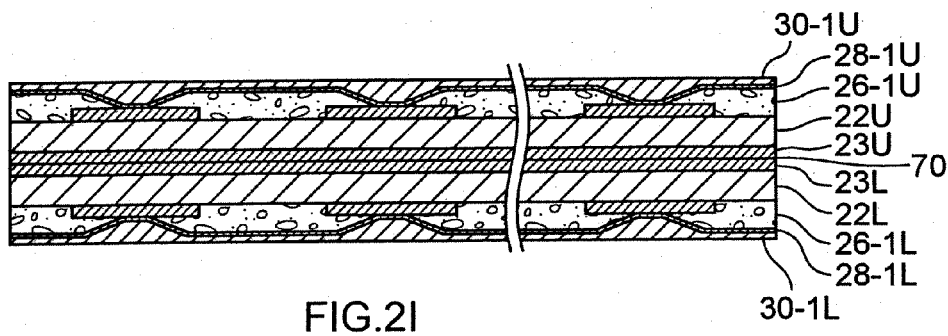

Then, as shown in FIG. 2I, the electroless plated layers 28-1U and 28-1L are used as power supplying layers (electrodes) and electrolytic copper plated layers 30-1U and 30-1L with a thickness of approximately several 10 s of microns are respectively formed by electrolytic copper plating. It should be noted that the above electrolytic plated layers 30-1U and 30-1L may be formed by electrolytic solder plating. Further, the whole of the copper plated layers 28-1U, 30-1U, 28-1L and 30-1L may be formed by electroless copper plating. After that, the surfaces thereof may be flattened by a suitable method if requested.

Figure 2J:
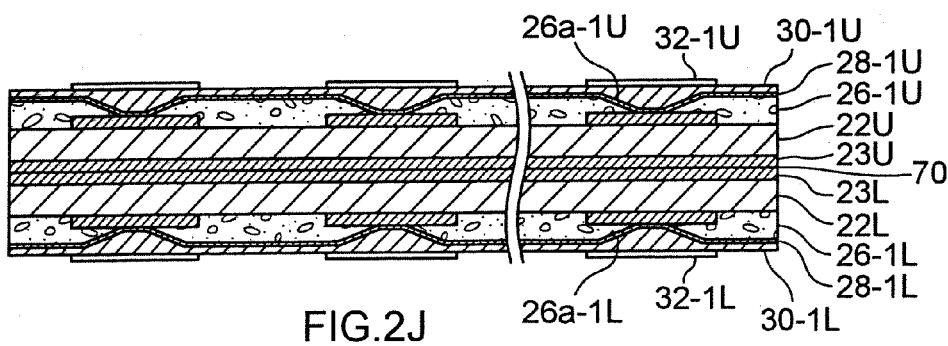

Then, as shown in FIG. 2J, etching resists 32-1U and 32-1L are respectively formed on the electrolytic copper plated layers 30-1U and 30-1L located above the openings 26a-1U and 26a-1L. For example, the etching resists 32-1U and 32-1L can be formed by photolithography process or screen printing.

Figure 2K:
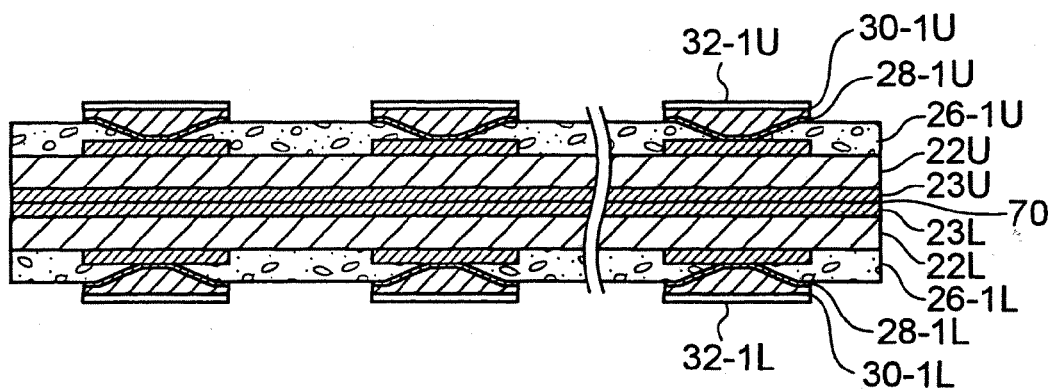

Then, as shown in FIG. 2K, the copper plated layers 28-1U, 30-1U, 28-1L and 30-1L are respectively removed from other portions than those covered with the etching resists 32-1U and 32-1L by etching.

Figure 2L:
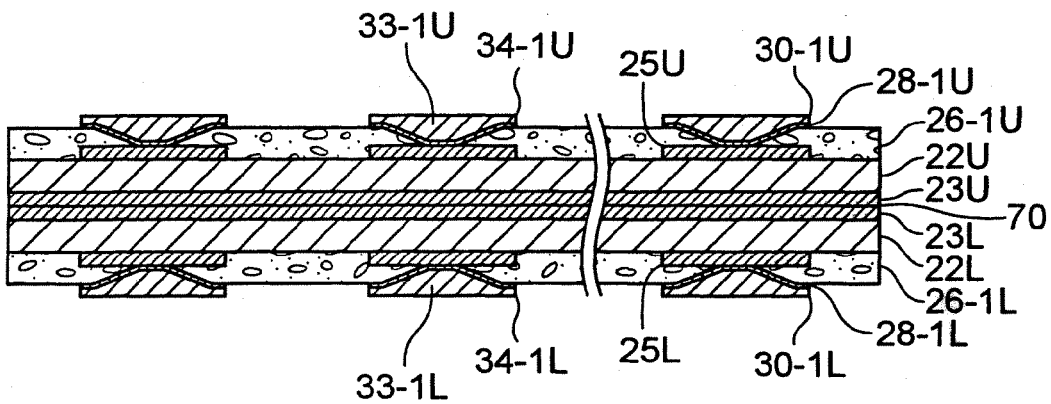

Then, as shown in FIG. 2L, the etching resists 32-1U and 32-1L are respectively removed from the copper plated layers 30-1U and 30-1L. In this manner, lands 34-1U and 34-1L using the copper plated layers 28-1U, 30-1U, 28-1L and 30-1L are respectively formed on the resin layers 26-1U and 26-1L. It should be noted that a well-known semi-additive method can be used as a method for forming these patterns.

At this stage, the surface state is such one that the lands 34-1U and 34-1L are respectively formed on the resin layers 26-1U and 26-1L, and this surface state is substantially the same structure as those of the laminates 22U and 22I in which the lands 25U and 25L are formed as shown in FIG. 2E. Accordingly, it is possible to respectively form necessary layers on the resin layers 26-1U and 26-1L by repeating the processes shown in FIGS. 2F to 2L the number of times corresponding to the number of necessary layers. In this embodiment, these processes are repeated once more.

Figure 2M:
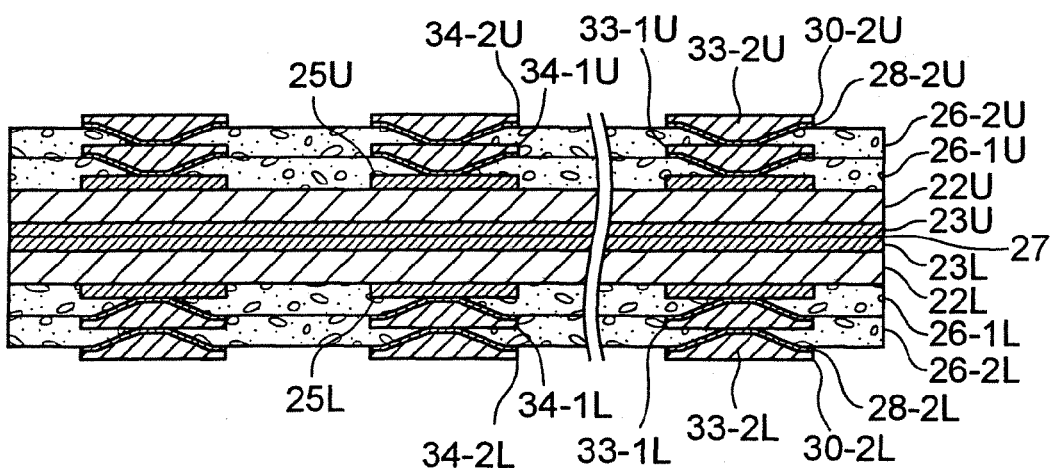

As shown in FIG. 2M, first and second resin layers 26-1U, 26-2U, 26-1L and 26-2L can be formed respectively by repeating the processes shown in FIGS. 2F to 2L once more. It should be noted that, while only the forming of the lands has been illustrated and described with reference to FIGS. 2C to 2F in order to simplify the explanation, the first embodiment of the present invention is not limited thereto and conductor circuits except the lands can also be formed in these processes at the same time.

Figure 2N:
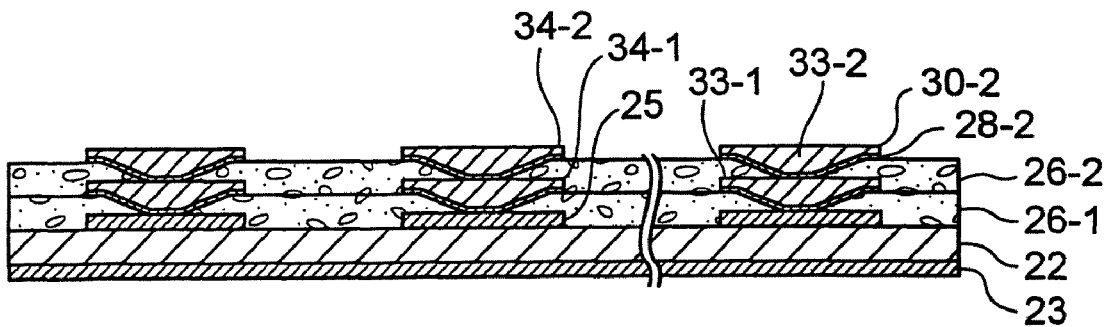

Then, as shown in FIG. 2N, the two sets of printed wiring boards are separated from each other at this stage. If the two sets of printed wiring boards are bonded by a thermoplastic resin, then they are exposed to softening and melting temperatures and thereby they may be separated from each other. If the two sets of printed wiring boards are joined by a removable resist, then they may be dipped in a suitable release solution and thereby separated from each other. If the two sets of printed wiring boards are joined by soldering, then they are exposed to a solder melting temperature and thereby separated from each other. Since the solder melting temperature is very high, it is preferable that the soldered portion should be heated locally.

At the stage in which the copper foil 23 is etched if requested, the printed wiring board 19, shown in FIG. 1A, produced by the ordinary build-up process may be completed. That is, in the manufacturing of the printed wiring board 19, two sets of printed wiring boards can be treated at the same time by the treatment processes shown in FIGS. 2B to 2N.

Further, when the printed wiring board (see FIG. 1B) which is very difficult to warp is manufactured, the copper foil 23 is not etched but the separated printed wiring boards may be separately treated by the succeeding processes. It should be noted that the bonding surface should preferably be cleansed in order to remove the adhesive or solder residues.

Figure 2O:
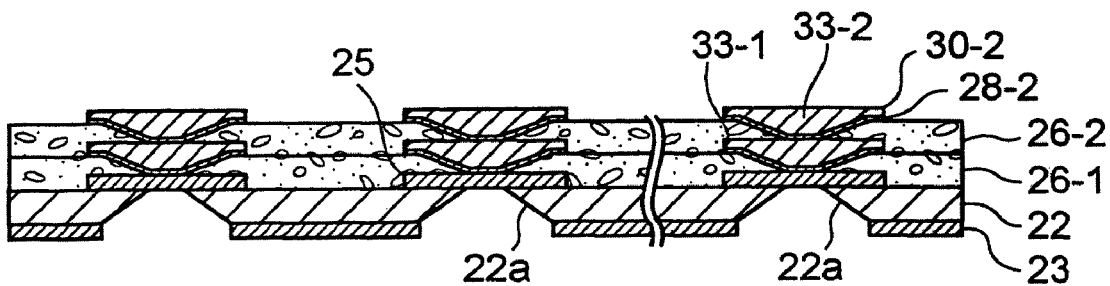

Then, as shown in FIG. 2O, after the copper foil portion was removed from the via hole forming opening portion of the lower copper foil 23 by the photolithography process or screen printing, the via hole forming opening portion 22a is formed on the lower surface portion of the laminate 22 located under the land 25 with laser irradiation. At that time, the land 25 may function as the stopper required when the via hole forming opening 22a is formed, thereby preventing the opening 22a from extending beyond the lower surface of the land 25. Accordingly, the direction of the via hole forming opening 22a formed on the core layer 22 becomes opposite to that of the via hole opening formed on the resin layer. The opening 22a may be shaped like an inverse trapezoid in which it is wide in the front and progressively narrowed in the bottom.

Figure 2P:
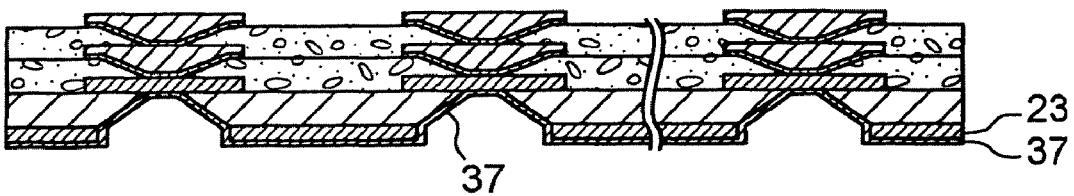

As shown in FIG. 2P, an electroless plated layer 37 is formed on the laminate 22 with the opening 22a by electroless copper plating. If requested, catalytic nucleus may be formed relative to electroless plating by sputtering or plating before the electroless copper plating process. At that time, the opposite surface should preferably be protected from deposition of plating by using a suitable material such as a resist and a PET film.

Figure 2Q:
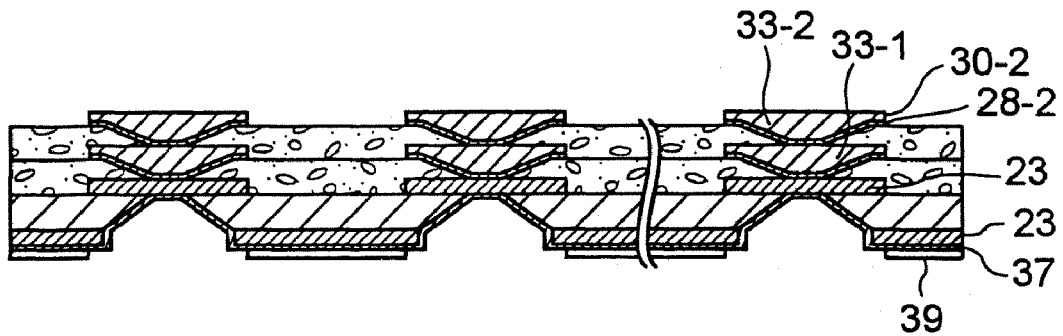

Then, as shown in FIG. 2Q, a plating resist 39 is formed on the electroless plated layer 37 at its portion other than the via hole forming portion and conductor circuit forming portion (not shown). For example, the plating resist 39 can be formed on the electroless plated layer 37 by photolithography process or screen printing.

Figure 2R:
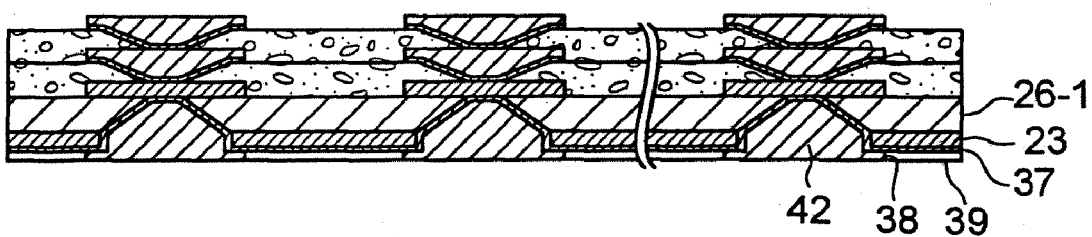

Then, as shown in FIG. 2R, the electroless plated layer 37 is used as a power supply layer and an electrolytic copper plated layer 38 is formed by electrolytic copper plating, whereby the via hole 42 of which opening is directed in the direction opposite to those of the via holes 33-1 and 33-2 is formed. The via hole 42 may have a trapezoid cross-section in which it is narrowed in the upper direction and widened in the lower direction. It should be noted that the whole of the copper plated layers 37 and 38 may be formed by electroless copper plating.

Figure 2S:
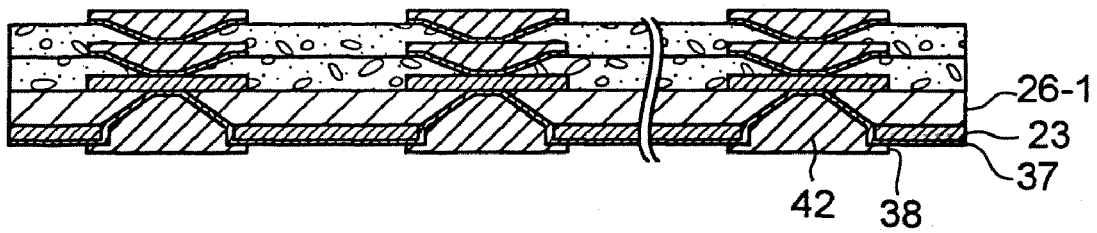

As shown in FIG. 2S, the plating resist 39 is removed from the electroless plated layer 37.

Figure 2T:
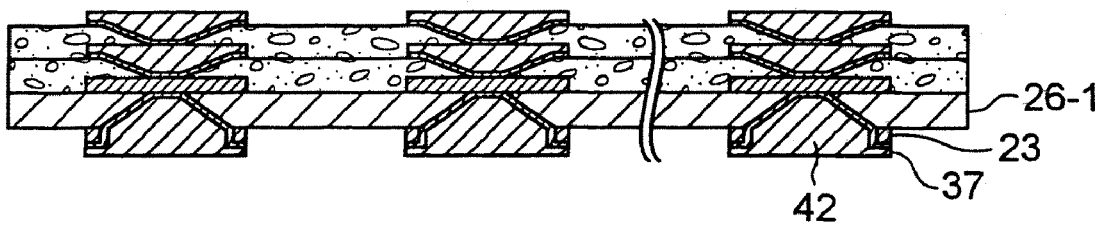

Then, as shown in FIG. 2T, a suitable resist may be formed on the via hole 42, for example, and the electroless plated layer 37 and the copper foil 23 may be removed by etching. Thereafter, the used etching resist is removed from the via hole 42. If requested, the lands on both surfaces of or on the single surface of the resin layer may be coated at its portions except the soldered portions with a solder resist (not shown), thereby preventing the occurrence of troubles such as solder bridge. In this manner, the multilayer printed wiring board shown in FIG. 1B can be manufactured. More specifically, in the manufacturing process of the printed wiring board 20, two sets of printed boards can be treated at the same time by the treatment processes shown in FIGS. 2B to 2T.

First Embodiment

While the above-mentioned manufacturing method according to the first embodiment of the present invention relates to the multilayer printed wiring board including the core layer, a manufacturing method according to a second embodiment of the present invention relates to a coreless multilayer printed wiring board of which lowermost layer is a resin layer without core material such as a glass cloth.

Figure 3A:
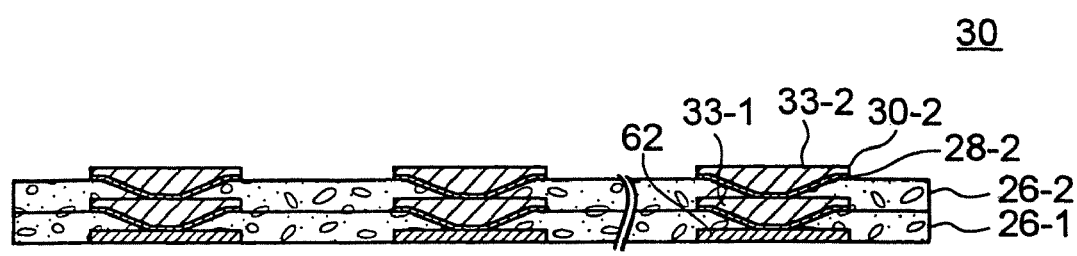
FIG. 3A is a cross-sectional view of an example of a multilayer printed wiring board according to the second embodiment of the present invention.

FIG. 3A is a cross-sectional view showing arrangements of multilayer printed wiring boards 30 and 31 according to a second embodiment of the present invention. The multilayer printed wiring board 30 shown in FIG. 3A is a multilayer printed wiring board manufactured by the ordinary build-up process.

Figure 3B:
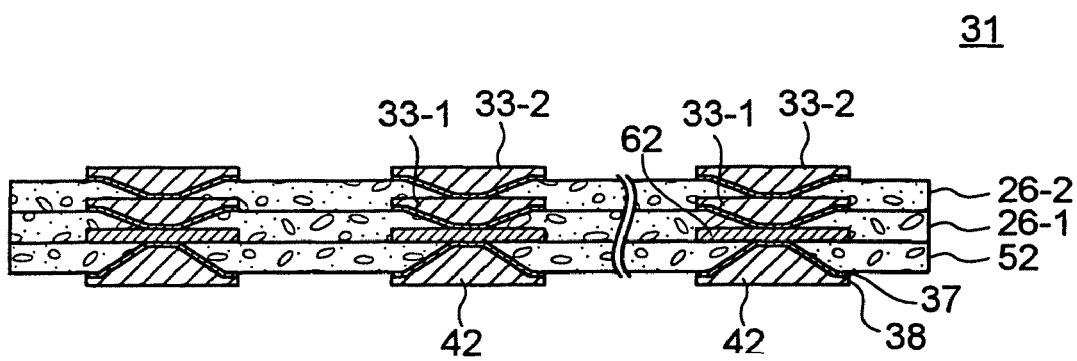
FIG. 3B is a cross-sectional view of another example of the multilayer printed wiring board according to the second embodiment of the present invention.

Although the multilayer printed wiring board 31 shown in FIG. 3B is a multilayer printed wiring board similarly manufactured by the ordinary build-up process, it is to be understood that it is a multilayer printed wiring board which is difficult to warp and in which malconnection between it and a semiconductor device mounted thereon can be decreased.

The printed wiring board 30 shown in FIG. 3A is composed of resin layers 26-1 and 26-2 and the printed wiring board 31 shown in FIG. 3B is composed of resin layers 52, 26-1 and 26-2. However, the via hole opening directions and the shapes of via holes of the multilayer printed wiring boards according to the second embodiment of the present invention are similar to those of the multilayer printed wiring boards according to the first embodiment of the present invention and they may have advantages (effects) similarly caused as described above.

The printed wiring boards 30, 31 may construct coreless wiring boards on the whole. Accordingly, as compared with the printed wiring boards 19 and 20 including the core layers, the printed wiring boards 30 and 31 is lacking in dimension stability but they are rich in flexibility because they are the coreless wiring boards. Therefore, the printed wiring boards 30 and 31 may have properties capable of easily absorbing expansion and contraction generated in the wiring board upon reflow of solder bumps.

The multilayer printed wiring boards 30 and 31 may have the following advantages:

(1) In particular, in the printed wiring board 31, the multilayer printed board 30 can be prevented from warping substantially even when it is heated upon reflow process of solder bumps. Hence, it is to be understood that the printed wiring board 31 is substantially free from the problem of malconnection between the semiconductor device and the printed board; and (2) The printed wiring board 31 is not only difficult to warp but also it is rich in flexibility because it becomes the coreless printed wiring board. Thus, the printed wiring board 31 may have properties to easily absorb expansion and contraction generated in the printed board upon reflow process of solder bumps. Accordingly, the printed wiring board 31 is able to absorb a difference between the coefficients of thermal expansion of the semiconductor device and the multilayer printed board 30 and the printed wiring board 31 can be substantially prevented from being cracked due to the above difference between the coefficients of thermal expansion of the semiconductor device and the multilayer printed board 30.

It should be noted that, while FIGS. 3A and 3B introduce the first and second resin layers (bilayer) 26-1 and 26-2 as resin layers formed on a support plate (copper plate) as will be described later on, the present invention is not limited thereto and the printed board according to the second embodiment of the present invention can be formed as a printed board including one or more than three layers of necessary resin layers.

(Manufacturing Method)

Next, a manufacturing method of the multilayer printed wiring boards 30 and 31 shown in FIGS. 3A and 3B will be described successively with reference to FIGS. 4A to 4V. The second embodiment of the present invention is characterized in that two sets of printed wiring boards are bonded back to back with each other and treated simultaneously or successively in each process of the processes shown in FIGS. 4B to 4N and that the two sets of printed wiring boards are separated from each other, each set of printed wiring boards being treated individually in the succeeding processes shown in FIGS. 4N to 4V. In this way, the efficient multilayer printed wiring board manufacturing can be achieved on the whole.

Figure 4A:
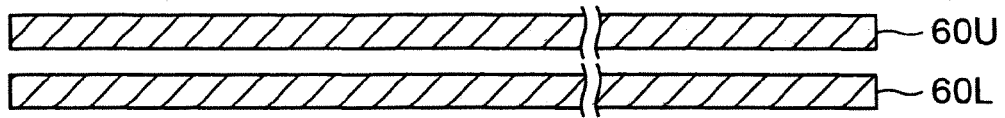
FIGS. 4A to 4V are diagrams showing respective processes of a multilayer printed wiring board manufacturing method according to the second embodiment of the present invention, respectively.
Figure 4B:
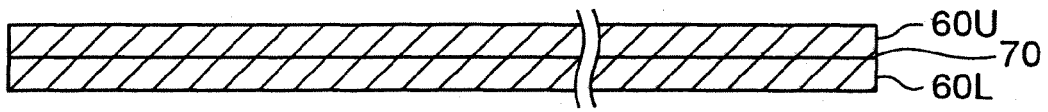
Figure 4C:
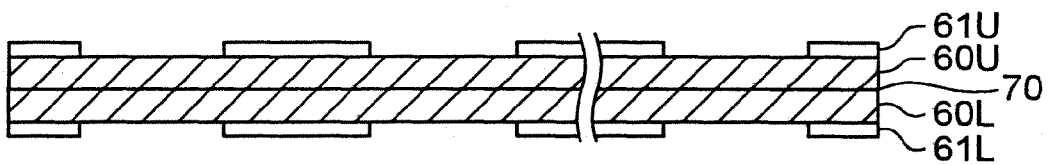
Figure 4D:
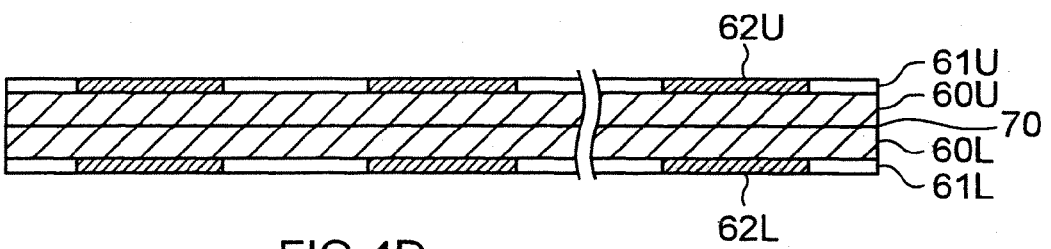
Figure 4E:
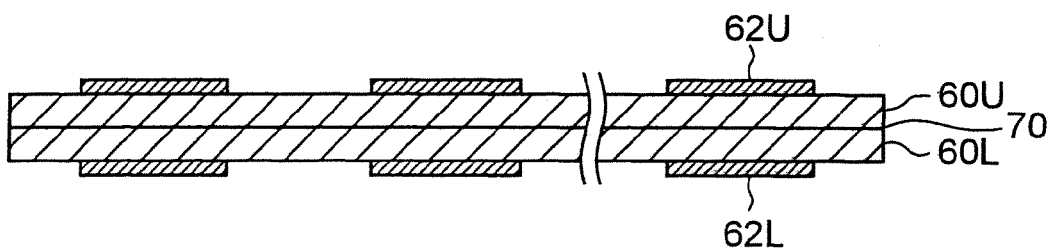
Figure 4F:
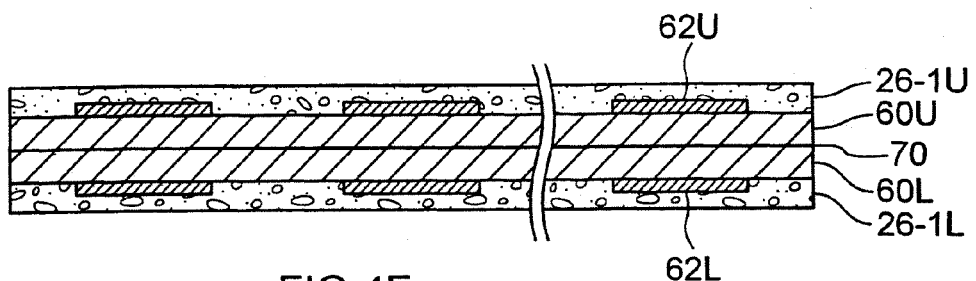
Figure 4G:
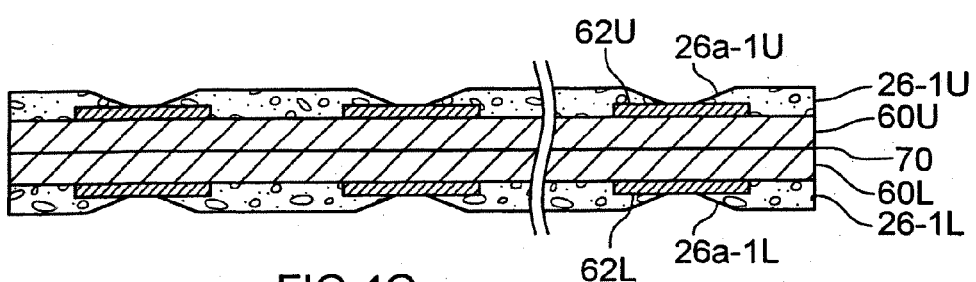
Figure 4H:
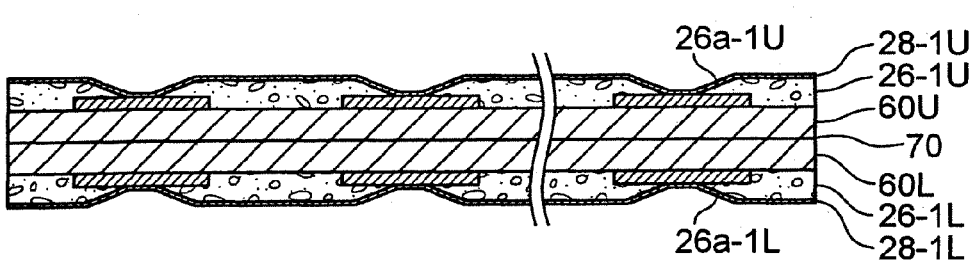
Figure 4I:
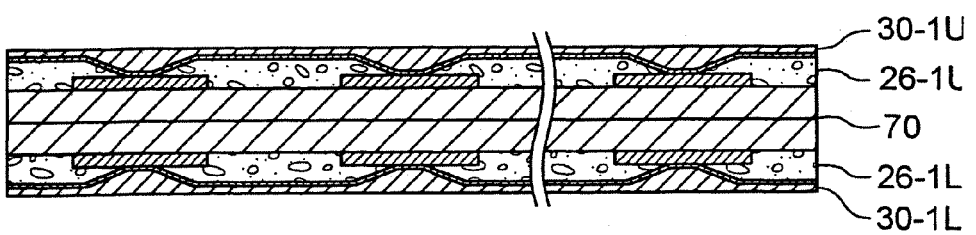
Figure 4J:
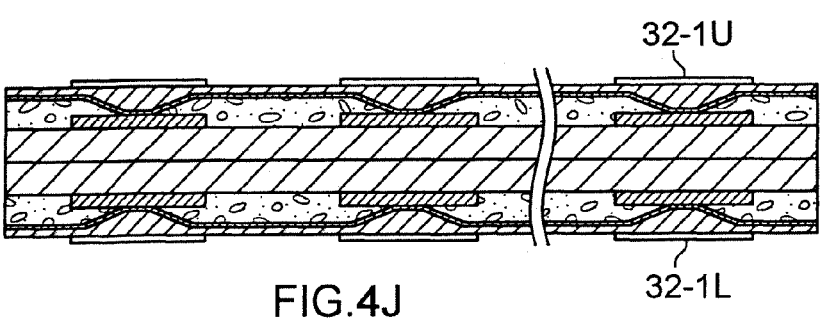
Figure 4K:
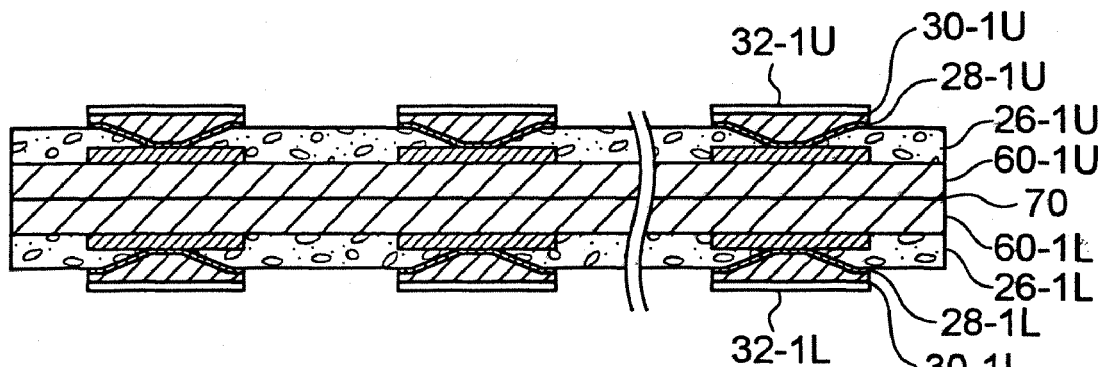
Figure 4L:
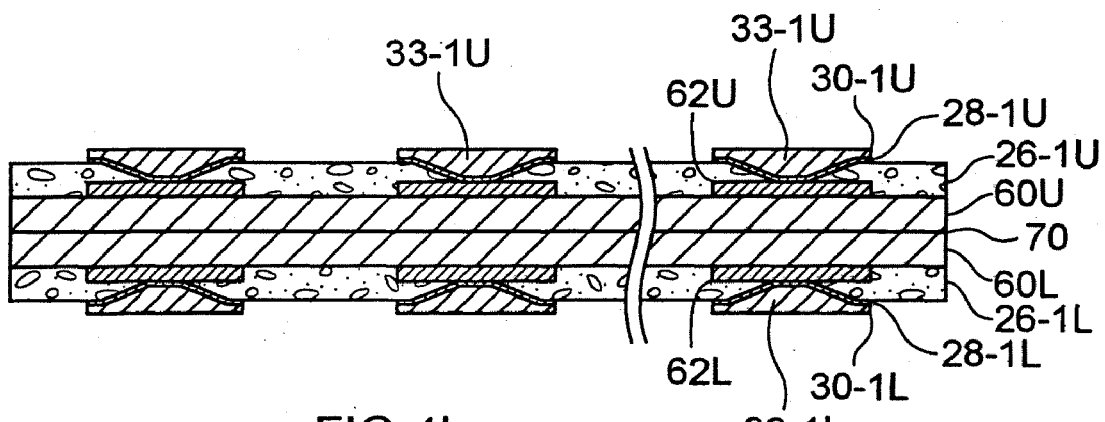
Figure 4M:
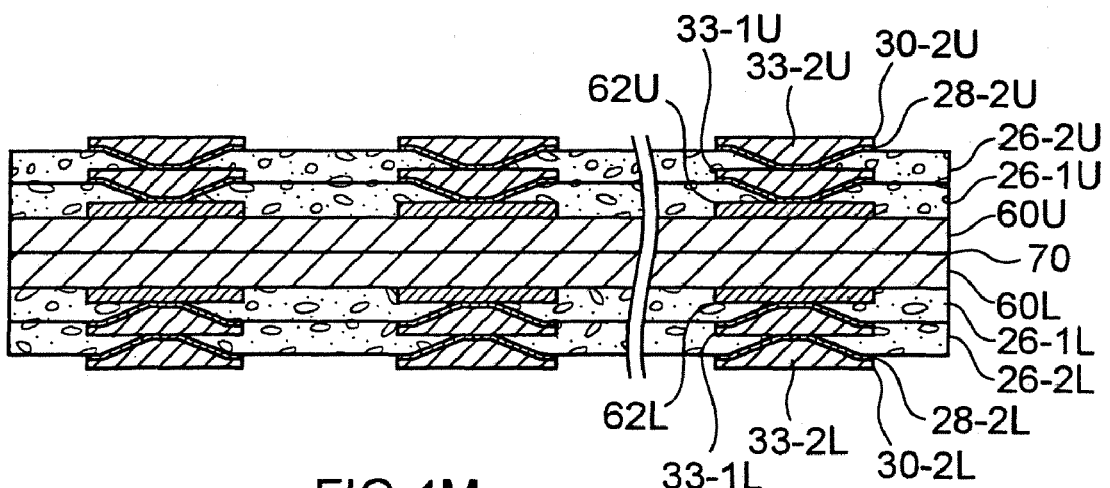
Figure 4N:
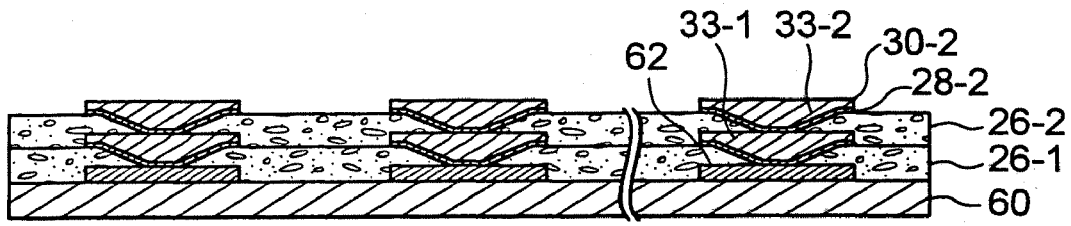
Figure 4O:
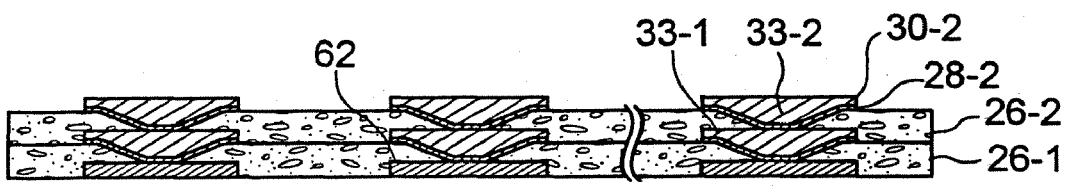
Figure 4P:
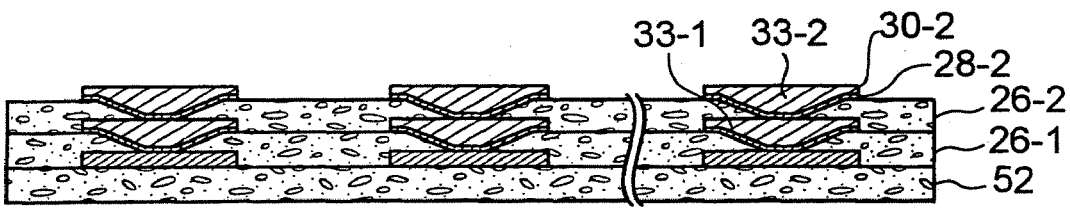
Figure 4Q:
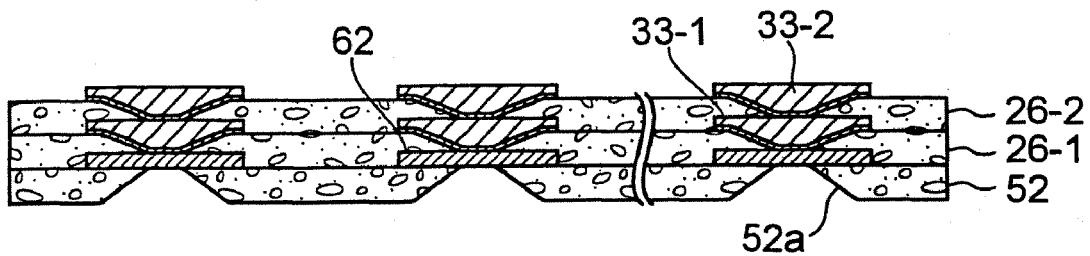
Figure 4R:
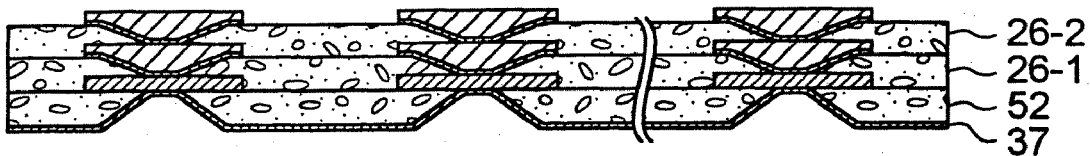
Figure 4S:
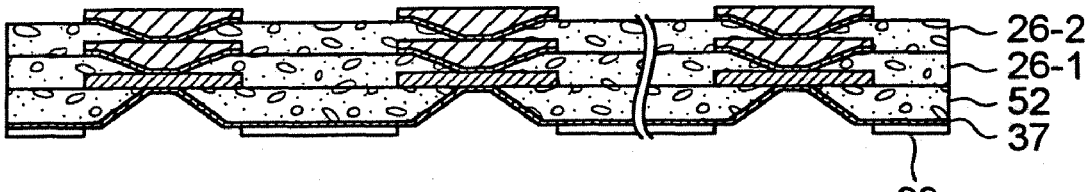

With respect to the respective processes shown in FIGS. 4A to 4S, any process substantially identical to that of the aforementioned processes shown in FIGS. 2A to 2T will be referred to as a "substantially identical process" and therefore need not be described.

As shown in FIG. 4A, two support plates 60U and 60L are respectively prepared as starting materials, and it is preferable that the support plates 60U and 60L should be formed of copper plates, for example.

As shown in FIG. 4B, the two copper plates 60U and 60L are bonded back to back with each other by adhesive 70. Any adhesives may be used as the adhesive 70 insofar as they can satisfy the conditions that have been described so far with reference to FIG. 2B. For example, it is possible to select thermoplastic resins that can be prevented from being softened and melted at temperatures in which they are treated in the respective processes shown in FIGS. 4B to 2M but that can be softened and melted at a temperature less than the temperature at which the printed wiring board is caused to deteriorate or a temperature under the soldering temperature. Alternatively, the printed wiring boards may be coated with a removable resist and thereby compression-bonded together. Furthermore, the printed wiring boards may be bonded to each other by soldering. If the printed wiring boards are bonded to each other by soldering, then it is preferable that they should not be bonded together on the whole surface but that they should be partly bonded together by soldering.

Then, as shown in FIG. 4C, plating resists 61U and 61L are respectively formed on the upper copper plates 60U and 60L. For example, a dry film is laminated on the copper plates 60U and 60L on which the plating resists 61U and 61L are respectively formed by photolithography process. Alternatively, the plating resists 61U and 61L may be respectively formed on the copper plates 60U and 60L by coating a liquid resist on the copper plates 60U and 60L according to screen printing.

Then, as shown in FIG. 4D, the copper plates 60U and 60L are used as power supply layers and copper plated layers 62U and 62L are formed on the copper plates 60U and 60L at their portions other than the patterns of the plating resists 61U and 61L, respectively. It should be noted that seed layers (not shown) made of a chromium layer and a copper layer may be plated on the copper plates 60U and 60L in advance to form underlying layers of the copper plated layers 62U and 62L so as to function as etching stoppers used when the copper plates 60U and 60L are treated by an etching process shown in FIG. 4O which will be described later on.

Then, as shown in FIG. 4E, the plating resists 61U and 61L are removed from the upper surfaces of the copper plates 60U and 60L. In this manner, the portions 62U and 62L, which are requested to remain as lands and patterns of conductor circuits and the like (hereinafter simply referred to as "lands") are formed on the copper plates 60U and 60L, respectively.

The next process, shown in FIG. 4F, to respectively form the resin layers 26-1U and 26-1L on the upper surfaces of the copper plates 60U and 60L is substantially identical to the process shown in FIG. 2F. The next opening forming process shown in FIG. 4G is substantially identical to the process shown in FIG. 2G. The next electroless plating process shown in FIG. 4H is substantially identical to the process shown in FIG. 2H. The next electrolytic copper plating process shown in FIG. 4I is substantially identical to the process shown in FIG. 2I. The next etching resist forming process shown in FIG. 4J is substantially identical to the process shown in FIG. 2J. The next etching process shown in FIG. 4K is substantially identical to the process shown in FIG. 2K. The next etching resist removing process shown in FIG. 4L is substantially identical to the process shown in FIG. 2L.

At this stage, the surface state is such one that lands 30-1U and 30-1L are respectively formed on the resin layers 26-1U and 26-1L, and this surface state is substantially the same shape as those of the copper plates 60U and 60L in which the lands 62U and 62L are formed as shown in FIG. 4E. Accordingly, it is possible to respectively form necessary layers on the resin layers 26-1U and 26-1L by repeating the processes shown in FIGS. 4F to 4L the number of times corresponding to the number of necessary layers. In this embodiment, these processes are repeated once more.

As shown in FIG. 4M, the first and second resin layers 26-1 and 26-2 (i.e. 26-1U, 26-2U, 26-1L and 26-2L) can be formed respectively by repeating the processes shown in FIGS. 4F to 4L once more. It should be noted that, while only the forming of the lands has been illustrated and described so far in order to simplify the explanation of the second embodiment of the present invention, the second embodiment is not limited thereto and conductor circuits except the lands can also be formed in the land forming process at the same time.

Then, as shown in FIG. 4N, the two sets of printed wiring boards are separated from each other at this stage. If the two sets of printed wiring boards are bonded by a thermoplastic resin, then they are exposed to softening and melting temperatures of this thermoplastic resin and thereby separated. If the two sets of printed wiring boards are joined by a removable resist, then they may be dipped in a suitable release solution and thereby separated. If the two sets of printed wiring boards are joined by soldering, then they are exposed to a solder melting temperature and thereby separated. Since the solder melting temperature is very high, it is preferable that the soldered portion of the printed wiring boards should be heated locally.

In the succeeding processes, the thus separated printed wiring boards may be treated separately. It should be noted that the bonding surface should preferably be cleansed in order to remove the adhesive or solder residues.

Then, as shown in FIG. 4O, the copper plate 60 is removed by etching. It should be noted that, if the seed layer is plated on the resin layer as the underlying layer of the copper plated layer 62 in the process shown in FIG. 4D, then this seed layer may function as an etching stopper. At this stage, the printed wiring board (FIG. 3A) based on the ordinary build-up process is completed.

Further, when the printed wiring board which is difficult to warp (see FIG. 3B) is manufactured, the succeeding treatment processes should be executed continuously.

As shown in FIG. 4P, the resin layer 52 is formed on the lower surface of the resin layer 26-1. This resin layer 52 may be typically formed by heat-curing a suitable sheet or film material such as a semi-cured resin sheet and a resin film after it was bonded to the lower surface of the resin layer. Alternatively, the resin layer 52 may be formed on the lower surface of the resin layer by treating a resin according to screen printing before it is cured.

As shown in FIG. 4Q, the via hole forming opening 52a is formed on the portion of the resin layer 42 located below the land 62 with laser irradiation. At that time, the land 62 may function as a stopper required when the via hole forming opening 52a is formed so that the opening 52a can be prevented from extending over the upper surface of the land 62. The opening 52a may be shaped like an inverse trapezoid in which it is widened in the front and narrowed in the bottom.

Next, as shown in FIG. 4R, the electroless plated layer 37 is formed on the laminate 52 by electroless copper plating. If requested, catalytic nucleus may be formed relative to electroless plating by sputtering or plating before the electroless copper plating process. At that time, the opposite surface should preferably be protected from deposition of plating by using a suitable material such as a resist and a PET film.

Figure 4T:
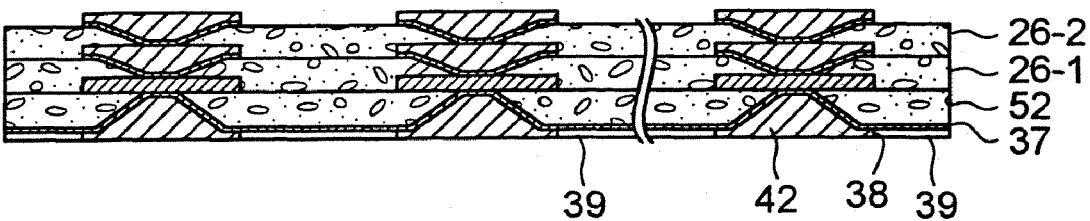
Figure 4U:
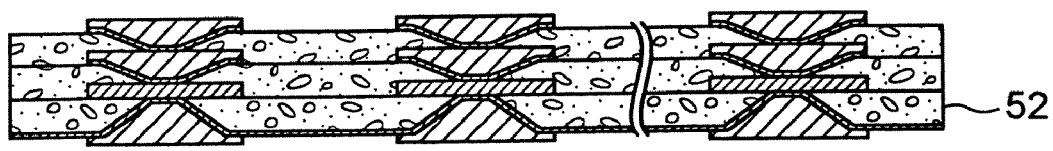

The next plating resist forming process shown in FIG. 4S is substantially identical to the process shown in FIG. 2Q. The next electrolytic copper plating process shown in FIG. 4T is substantially identical to the process shown in FIG. 2R. The next plated resist removing process shown in FIG. 4U is substantially identical to the process shown in FIG. 2S.

Figure 4V:
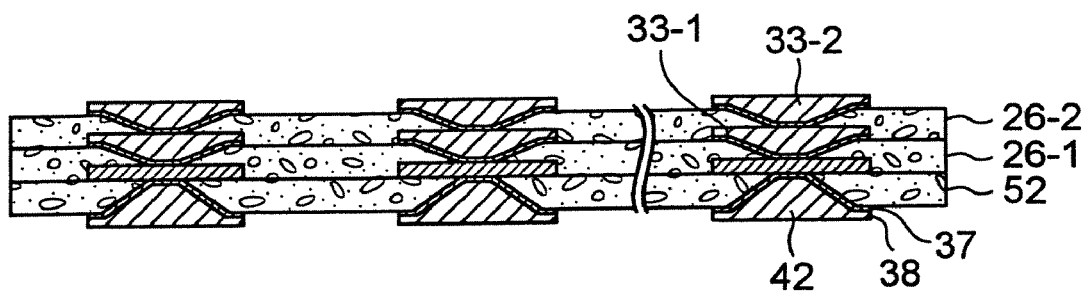

As shown in FIG. 4V, the electroless plated layer 37 is removed from the resin layer 52 at its portion other than the via hole 42 by quick etching process. At that time, the etching resist may be used in the portion of the via hole 42. As a consequence, the multilayer printed wiring board 31 shown in FIG. 3B can be manufactured.

[Other Matters]

While the embodiments of the present invention have been described so far, these embodiments are illustrated and explained by way of example. Therefore, the present invention is not limited to those embodiments and can be variously changed and modified by those skilled in the art.

(1) According to the above-described embodiments, since the two sets of copper clad laminates (or support plates) are fixed by the adhesive during the manufacturing process of the multilayer printed wiring boards, it becomes possible to treat the two multilayer printed wiring boards bonded to each other by one treatment in each treatment process and hence it becomes possible to manufacture the two multilayer printed wiring boards at the same time in almost all ranges of the manufacturing process. In the treatment stage from the bonding surface side of the multilayer printed wiring board, the two multilayer printed wiring boards are warmed up to a temperature at which the adhesive is melted or softened and thereby separated from each other, whereafter the succeeding treatment processes are executed;

(2) Present typical example was described in each manufacturing process. Accordingly, it is natural that factors such as materials and manufacturing conditions should be changed depending on various situations; and (3) The embodiments of the present invention have been described so far with reference to the example in which the semiconductor device is mounted on the upper surface of the printed wiring board. However, the present invention includes a case in which mounting parts such as semiconductor devices are mounted on the lower surface or both surfaces of the printed wiring board.

Accordingly, the technical scope of the present invention may be determined by the scope of the appended claims.

It should be understood by those skilled in the art that various modifications, combinations, sub-combinations and alterations may occur depending on design requirements and other factors insofar as they are within the scope of the appended claims or the equivalents thereof.

What is claimed is:

1. A printed wiring board manufacturing method comprising:
   preparing two copper clad laminates each comprising a resin layer and at least one copper foil laminated to the resin layer;
   bonding said two copper clad laminates such that the copper clad laminates are adhered foil to foil on respective bonding surfaces of the copper clad laminates;
   forming lands on respective non-bonding surfaces of said copper clad laminates;
   forming respective resin layers on the lands and the respective non-bonding surfaces of said copper clad laminates;
   forming via hole openings connected to the lands, respectively;
   forming via holes comprising a conductive material in the via hole openings, respectively;
   separating said copper clad laminates from each other at the respective bonding surfaces; and
   forming opposing via hole openings connected to the lands, respectively, from the respective bonding surfaces separated from each other with the opposing via hole openings are formed on opposite sides of the via holes with respect to the lands.

2. A printed wiring board manufacturing method according to claim 1, wherein each of said copper clad laminates comprises a material produced by heating and pressing a glass woven or non-woven fabric base material with the copper foils laminated on one or double side thereof after being impregnated with a thermosetting resin.

3. A printed wiring board manufacturing method according to claim 1, further comprising repeating the forming of the respective resin layers on top of respective surfaces of preceding respective resin layers and the forming of the via hole openings and the via holes in the respective resin layers.

4. A printed wiring board manufacturing method according to claim 1, wherein said bonding of said copper clad laminates comprises adhering the copper clad laminates with a thermosetting resin that is not softened and melted at a treatment temperature of each process but that is softened and melted at a temperature below a temperature at which a printed wiring board is caused to be deteriorated.

5. A printed wiring board manufacturing method according to claim 4, wherein said temperature below a temperature at which the printed wiring board is caused to be deteriorated is under 240° C.

6. A printed wiring board manufacturing method according to claim 1, wherein said bonding of the copper clad laminates comprises adhering the copper clad laminates with a removable resist as adhesive.

7. A printed wiring board manufacturing method according to claim 1, wherein said bonding of the copper clad laminates comprises partially soldering said copper clad laminates.

8. A printed wiring board manufacturing method comprising:
   preparing two support plates each comprising a front surface and a back surface;
   bonding said two support plates such that the support plates are adhered back surface to back surface on respective bonding surfaces of the support plates;
   forming lands on respective non-bonding surfaces of said support plates;
   forming first resin layers on the lands and the non-bonding surfaces of said support plates, respectively;
   forming via hole openings connected to the lands, respectively;
   separating said support plates from each other at the respective bonding surfaces;
   removing said support plates from the first resin layers, respectively;
   forming second resin layers on the lands and surfaces of said first resin layers separated from the support plates, respectively; and
   forming opposing via hole openings connected to the lands, respectively, the via hole openings extending from the surfaces of the first resin layers separated from the support plates through the second resin layers, respectively, such that the opposing via hole openings are formed on opposite sides from which the via holes are formed with respect to the lands.

9. A printed wiring board manufacturing method according to claim 8, wherein said support plate is formed of a copper plate.

10. A printed wiring board manufacturing method according to claim 8, further comprising repeating the forming of the respective first resin layers on top of respective surfaces of preceding respective first resin layers and the forming of the via hole openings and the via holes in the respective first resin layers.

11. A printed wiring board manufacturing method according to claim 8, wherein the bonding of the support plates comprising adhering the support plates with a removable resist as adhesive.

12. A printed wiring board manufacturing method according to claim 8, wherein said bonding of the support plates comprises partially soldering the support plates.

13. A printed wiring board manufacturing method according to claim 8, wherein the bonding of the support plates comprises adhering the support plates with a thermosetting resin that is not softened and melted at a treatment temperature of each process but that is softened and melted at a temperature below a temperature at which a printed wiring board is caused to be deteriorated.

14. A printed wiring board manufacturing method according to claim 13, wherein said temperature below a temperature at which the printed wiring board is caused to be deteriorated is under 240° C.

* * * * *